United States Patent
Pezeshki

(10) Patent No.: US 6,879,442 B2
(45) Date of Patent: Apr. 12, 2005

(54) METHOD AND SYSTEM FOR SELECTING AN OUTPUT OF A VCSEL ARRAY

(75) Inventor: Bardia Pezeshki, Redwood City, CA (US)

(73) Assignee: Santur Corporation, Fremont, CA (US)

(*) Notice: Subject to any disclaimer, the term of this patent is extended or adjusted under 35 U.S.C. 154(b) by 47 days.

(21) Appl. No.: 10/216,132

(22) Filed: Aug. 8, 2002

(65) Prior Publication Data

US 2003/0030919 A1 Feb. 13, 2003

Related U.S. Application Data

(60) Provisional application No. 60/311,623, filed on Aug. 8, 2001.

(51) Int. Cl.[7] ........................... G02B 26/08; G02B 27/10
(52) U.S. Cl. ........................ 359/626; 359/196; 359/210
(58) Field of Search ............................. 359/196, 626, 359/204–205, 209–210, 212, 223, 225, 391, 414, 417, 418, 694, 554–557, 813, 696; 385/16, 17, 22, 92, 93

(56) References Cited

U.S. PATENT DOCUMENTS

| | | |
|---|---|---|
| 3,924,937 A | 12/1975 | Munroe et al. |
| 4,317,611 A | 3/1982 | Petersen |
| 4,359,773 A | 11/1982 | Swartz et al. |
| 4,498,730 A | 2/1985 | Tanaka et al. |
| 4,815,087 A * | 3/1989 | Hayashi |
| 4,820,899 A | 4/1989 | Hikima et al. |
| 5,136,598 A | 8/1992 | Weller et al. |
| 5,228,050 A | 7/1993 | LaCourse et al. |
| 5,274,489 A | 12/1993 | Smith et al. |
| 5,283,796 A | 2/1994 | Fink |

(Continued)

FOREIGN PATENT DOCUMENTS

| | | |
|---|---|---|
| EP | 0924821 A1 | 6/1999 |
| FR | 2805092 | 8/2001 |
| JP | 56060088 | 5/1981 |
| JP | 11326707 | 11/1999 |
| JP | 2002246699 | 8/2002 |
| WO | WO 95/13638 | 5/1995 |
| WO | WO 02/13343 A2 * | 2/2002 |
| WO | WO 02/37069 A1 | 5/2002 |
| WO | WO 02/37621 A2 | 5/2002 |
| WO | WO 02/058197 A2 | 7/2002 |
| WO | WO 02/013343 A3 * | 7/2003 |

OTHER PUBLICATIONS

Internatinal Search Report dated Jan. 21, 2003 for International Application No. PCT/US01/24969 and mailed Jan. 28, 2003 (3 pages).

"Broadband Lightwave Sources and System", Gayton Photonics Ltd., http://www.infowin.org/ACTS/RUS/PROJECTS/ac065.htm, printed Oct. 17, 2000 (4 pages).

Dellunde, Jaume, "Laser diodes", http://www.geocities.com/jdellund/receng.htm, printed Aug. 8, 2001 (4 pages).

Hunter, D.K., et al., "Guided wave optical switch architectures. Part 1. Space switching", International Journal of Optoelectronics, vol. 9, No. 6, 1994 (pp. 477–487).

Solgaard, O., et al., "Optoelectronic Packaging Using Silicon Surface–Micromachined Alignment Mirrors", IEEE Photonics Technology Letters, vol. 7, No. 1, 1995 (pp. 41–43) (4 pages total).

(Continued)

Primary Examiner—Hung Xuan Dang
Assistant Examiner—Joseph Martinez
(74) Attorney, Agent, or Firm—Christie, Parker & Hale, LLP

(57) ABSTRACT

A tunable laser formed using a plurality of vertical cavity surface emitting lasers. The output of the vertical cavity surface emitting lasers are re-directed by a moveable element to an optical output.

19 Claims, 4 Drawing Sheets

U.S. PATENT DOCUMENTS

| | | | |
|---|---|---|---|
| 5,289,485 A | | 2/1994 | Mooradian |
| 5,291,502 A | | 3/1994 | Pezeshki et al. |
| 5,325,386 A | | 6/1994 | Jewell et al. |
| 5,378,330 A | | 1/1995 | Li et al. |
| 5,379,310 A | | 1/1995 | Papen et al. |
| 5,420,416 A | | 5/1995 | Iida et al. |
| 5,468,975 A | | 11/1995 | Valster |
| 5,491,576 A | | 2/1996 | Bergano |
| 5,504,609 A | | 4/1996 | Alexander et al. |
| 5,519,487 A | | 5/1996 | Atwood et al. |
| 5,550,850 A | | 8/1996 | Lee et al. |
| 5,612,968 A | | 3/1997 | Zah |
| 5,629,790 A | | 5/1997 | Neukermans et al. |
| 5,650,612 A | * | 7/1997 | Criswell et al. ............ 250/226 |
| 5,699,589 A | | 12/1997 | Ripley et al. |
| 5,715,047 A | | 2/1998 | Adamovsky |
| 5,771,253 A | | 6/1998 | Chang-Hasnain et al. |
| 5,777,763 A | | 7/1998 | Tomlinson, III |
| 5,784,183 A | | 7/1998 | Aoki et al. |
| 5,784,507 A | | 7/1998 | Holm-Kennedy et al. |
| 5,798,859 A | | 8/1998 | Colbourne et al. |
| 5,808,986 A | | 9/1998 | Jewell et al. |
| 5,825,792 A | | 10/1998 | Villeneuve et al. |
| 5,882,468 A | | 3/1999 | Crockett et al. |
| 5,930,045 A | | 7/1999 | Shirasaki |
| 5,949,544 A | | 9/1999 | Manning |
| 5,953,359 A | | 9/1999 | Yamaguchi et al. |
| 5,959,750 A | | 9/1999 | Eskildsen et al. |
| 5,977,567 A | | 11/1999 | Verdiell |
| 5,993,544 A | | 11/1999 | Knauss et al. |
| 5,999,303 A | | 12/1999 | Drake |
| 5,999,545 A | | 12/1999 | Jeon et al. |
| 6,044,705 A | | 4/2000 | Neukermans et al. |
| 6,049,554 A | | 4/2000 | Lang et al. |
| 6,078,394 A | | 6/2000 | Wood |
| 6,091,537 A | * | 7/2000 | Sun et al. ................... 359/248 |
| 6,097,860 A | * | 8/2000 | Laor ........................... 385/17 |
| 6,121,983 A | | 9/2000 | Fork et al. |
| 6,133,615 A | | 10/2000 | Guckel et al. |
| 6,175,668 B1 | | 1/2001 | Borrelli et al. |
| 6,183,092 B1 | | 2/2001 | Troyer |
| 6,201,629 B1 | | 3/2001 | McClelland et al. |
| 6,212,151 B1 | | 4/2001 | Heanue et al. |
| 6,227,724 B1 | | 5/2001 | Verdiell |
| 6,256,328 B1 | | 7/2001 | Delfyett et al. |
| 6,263,002 B1 | * | 7/2001 | Hsu et al. ...................... 372/6 |
| 6,275,315 B1 | | 8/2001 | Park et al. |
| 6,275,317 B1 | | 8/2001 | Doerr et al. |
| 6,316,764 B2 | | 11/2001 | Heffner et al. |
| 6,327,063 B1 | | 12/2001 | Rockwell |
| 6,350,064 B2 | | 2/2002 | Mitsuda et al. |
| 6,352,376 B2 | | 3/2002 | Walters et al. |
| 6,434,291 B1 | | 8/2002 | Kessler et al. |
| 6,445,514 B1 | | 9/2002 | Ohnstein et al. |
| 6,483,969 B1 | | 11/2002 | Yap et al. |
| 6,516,017 B1 | | 2/2003 | Matsumoto |
| 6,522,793 B1 | | 2/2003 | Szilagyi et al. |
| 2001/0017876 A1 | | 8/2001 | Kner et al. |
| 2001/0036206 A1 | | 11/2001 | Jerman et al. |
| 2001/0050928 A1 | | 12/2001 | Cayrefourcq et al. |
| 2002/0064192 A1 | * | 5/2002 | Missey et al. |
| 2002/0076480 A1 | | 6/2002 | Hsieh et al. |
| 2003/0039275 A1 | | 2/2003 | Pezeshki |

OTHER PUBLICATIONS

Li, G.P., et al., "16–Wavelength Gain–Coupled DFB Laser Array with Fine Tunability", IEEE Photonics Technology Letters, vol. 8, No. 1, Jan. 1996 (pp. 22–24).

Gordon, C., "Hybrid Mode–Locked DBR–laser", Multidisciplinary Optical Switching Technology Center, http://www.ece.ucsb.edu/MOST/33.html, (last updated Jan. 22, 1996), printed Aug. 5, 2001 (3 pages).

Daneman, M. J., et al., "Laser–to–Fiber Coupling Module Using a Micromachined Alignment Mirror", IEEE Photonics Technology Letters, vol. 8, No. 3, Mar. 1996 (pp. 396–398).

Wu, M., "Micromachining for Optical and Optoelectronic Systems", Proceedings of the IEEE, vol. 85, No. 11, Nov. 1997 (pp. 1833, 1943–1952).

Jacques, S., "Phase conjugate mirror and diffraction grating yield stable, collimated, coherent, high–power diode laser.", Oregon Medical Laser Center Newsletter, http://omlc.ogi.edu/news/dec97/pclaser.html, printed Apr. 9, 2001, (2 pages).

Shirasaki, M., "Chromatic–Dispersion Compensator Using Virtually Imaged Phased Array", IEEE Photonics Technology Letters, vol. 9, No. 12, Dec. 1997 (pp. 1598–1600).

Kudo, K., et al., "Multiwavelength microarray semiconductor lasers", Electronics Letters, vol. 34, No. 21, Oct. 15, 1998, (pp. 2037–2039).

Kopka, P., et al., "Bistable 2×2 and Multistable 1×4 Micromechanical Fibre–optic Switches on Silicon", Micro Opto Electro Mechanical Systems, MOEMS 1999 (4 pages).

"(BW)(OH–MARCONI–COMM–2) Marconi Communications Announces World–Beating Commercial Tuneable Laser at Telecom '99", Press Release, http://www.businesswire.com/cgi–bin/ts_headline.sh?/bw.101199/192842212, Oct. 11, 1999, printed Oct. 17, 2000 (2 pages).

Maluf, N., "Optical switches", An Introduction to Microelectromechanical Systems Engineering, 2000, pp. 187–190 (3 pages).

Nakano, H., "Technological Trends of Optical Communication Devices for DWDM", NEC Device Technology International 2000, No. 59 (5 pages).

Liu, F., et al., "Cost–effective wavelength selectable light source using DFB fibre laser array", Electronics Letters, vol. 36, No. 7, Mar. 30, 2000, pp. 620–621, (3 pages).

Hunwicks, A., "Advancing the Optical Component", http://www.telecoms–mag.com/issues/200004/tci/advancing-.html, Apr. 2000, printed Oct. 17, 2000 (6 pages).

Pezeshki, B., et al., "12nm tunable WDM source using an integrated laser array", Electronics Letters, vol. 36, No. 9, Apr. 27, 2000 (pp. 788–789).

Howe, P., "Light fantastic", digitalMASS at Boston.com, http://digitalmass.boston.com/news/daily/05/22/light_fantastic.html, printed Oct. 17, 2000 (5 pages).

Silverman, S., "Vcs beam big bucks at optics upstarts", Redherring .com, Oct. 9, 2000, http://www.redherring.com/vc/2000/1009/vc–optics100900.html?id=yahoo, printed Oct. 10, 2000 (5 pages).

International Search Report dated Nov. 1, 2002 for International Application No. PCT/US01/45691 and mailed Jan. 6, 2003 (3 pages).

International Search Report for International Application PCT/US02/25365, filed Aug. 8, 2002, mailed Feb. 13, 2003 (4 pages).

* cited by examiner

METHOD AND SYSTEM FOR SELECTING AN OUTPUT OF A VCSEL ARRAY

CROSS-REFERENCE TO RELATED APPLICATIONS

This application claims the benefit of Provisional Patent Application 60/311,623, entitled METHOD AND SYSTEM FOR SELECTING AN OUTPUT OF A VCSEL ARRAY, filed Aug. 8, 2001, the disclosure of which is incorporated by reference.

BACKGROUND

The present invention relates generally to tunable lasers, and more particularly to a tunable laser including a plurality of vertical cavity surface emitting lasers.

Data transmission systems often transmit data over fiber optic lines using dense wavelength division multiplexing (DWDM). In DWDM a number of light signals at differing wavelengths are used to simultaneously transmit data over a fiber optic line. Conventionally, each of the light signals is generated using a laser designed to optimally transmit light at a particular wavelength. A number of unique lasers is therefore used in system operation, which increases costs complicates system build out and replenishment logistics.

One type of laser suitable for some data transmission systems are vertical cavity surface emitting lasers (VCSELs). VCSELSs may be relatively easily manufactured on a substrate, and a number of VCSELs may be manufactured, usually in an array, on a single substrate. VCSELs are made with very short cavity lengths of typically a few microns, such that only one longitudinal Fabry-Perot mode falls within the gain bandwidth of the active quantum wells. VCSELs therefore naturally form a single longitudinal mode device. Of course if the lateral size of the device is too large, or if the lateral confinement is poor, multiple transverse modes may appear. Furthermore, some form of asymmetry is generally required to lock the mode to a single polarization.

Unlike other types of lasers, such as distributed feedback (DFB) lasers or distributed Bragg reflector (DBR) lasers, the wavelength of light emitted from a VCSEL depends simply on its cavity length. VCSELs emitting light at different wavelengths can be fabricated simply by varying the cavity length for different VCSELs. Tuning of the wavelength of emitted light is generally more complicated, however, as the cavity length generally must be electro-optically or mechanically varied. Therefore various tunable lasers have been demonstrated where the cavity length is adjusted by a micromechanical element, such as described in U.S. Pat. Nos. 5,291,502 and 5,771,253, the disclosures of which are incorporated by reference. The performance of such tunable lasers is generally compromised since small fluctuations or mechanical vibrations can cause the lasing frequency to shift.

VCSEL arrays can be made in two dimensions, and thus can be very compact. Various techniques can be used to modify the cavity length of such lasers arrays, such as described in U.S. Pat. No. 5,882,468, the disclosure of which is incorporated by reference. Unfortunately, coupling light, particularly sufficient light for use, from such arrays into a single mode fiber presents difficulties.

BRIEF SUMMARY OF THE INVENTION

The present invention provides a tunable laser using an array of VCSELs and a micromechanical structure moveable in two dimensions to select light from a particular VCSEL. In one embodiment the light is coupled to a fiber optic line for use in a DWDM data communication system.

In one aspect the invention provides an optical arrangement comprising a plurality of vertical cavity surface emitting lasers (VCSELs) having differing cavity lengths, each laser (VCSEL) adapted to emit light at differing wavelengths; an optical element moveable to direct light from a selected VCSEL towards an output path; and an optical output configured to receive light on the output path.

In another aspect the invention provides an optical arrangement comprising a plurality of lasers having differing cavity lengths, each laser configured to emit light; a plurality of lenses configured to receive light from each laser; a plurality of optical elements; an optical output; and an adjustment structure configured to position each optical element of the plurality of optical elements to direct light from the plurality of lenses to the optical output.

In another aspect the invention provides an optical arrangement comprising a plurality of lasers having differing cavity lengths, each laser configured to emit light; a plurality of lenses configured to receive light from each laser; a plurality of optical elements; an optical output; and an adjustment structure configured to position each optical element of the plurality of optical elements to direct light from the plurality of lenses to the optical output.

In another aspect the invention provides an optical arrangement comprising a plurality of lasers having differing cavity lengths, each laser configured to emit light; a movable lens configured to receive light from each laser; an actuator configured to move the movable lens; an optical output configured to receive light from the movable lens.

In another aspect the invention provides a wavelength tunable laser comprising a vertical cavity surface emitting laser (VCSEL) array including a first VCSEL laser diode that generates a first beam of light in a first wavelength range and a second VCSEL diode that generates a second beam of light in a second wavelength range; an optical waveguide; and a microelectromechanical (MEMS) optical element adjustable to selectively couple one of said first and second beams of light from said VCSEL array into said optical waveguide.

In another aspect the invention provides a method for providing a beam of laser light having a tunable wavelength, comprising the steps of providing a vertical cavity surface emitting laser (VCSEL) array; generating a first beam of light in a first wavelength range using a first VCSEL diode of said VCSEL array; generating a second beam of light in a second wavelength range using a second VCSEL diode of said VCSEL array; collimating at least one of said first and second beams of light; and tilting mirror using a MEMS actuator to selectively couple one of said first and second beams of light from said VCSEL array into said optical waveguide.

In another aspect the invention provides a telecommunication network including a tunable laser system, the tunable laser system providing an optical signal transmitting information over a fiber optic line, the optical signal being of a wavelength selected from a plurality of predetermined wavelengths, the tunable laser comprising an array of vertical cavity surface emitting lasers (VCSEL), each of the VCSELs emitting light in a predetermined wavelength range, at least some of the VCSELs emitting light in different wavelength ranges, a MEMS mirror moveable so as to couple light from any one of the VCSELs on a path expected to result in transmission of the light on the fiber optic line.

Many of the attendant features of this invention will be more readily appreciated as the same becomes better understood by reference to the following detailed description and considered in conjunction with the accompanying drawings.

DETAILED DESCRIPTION

Figure 1:
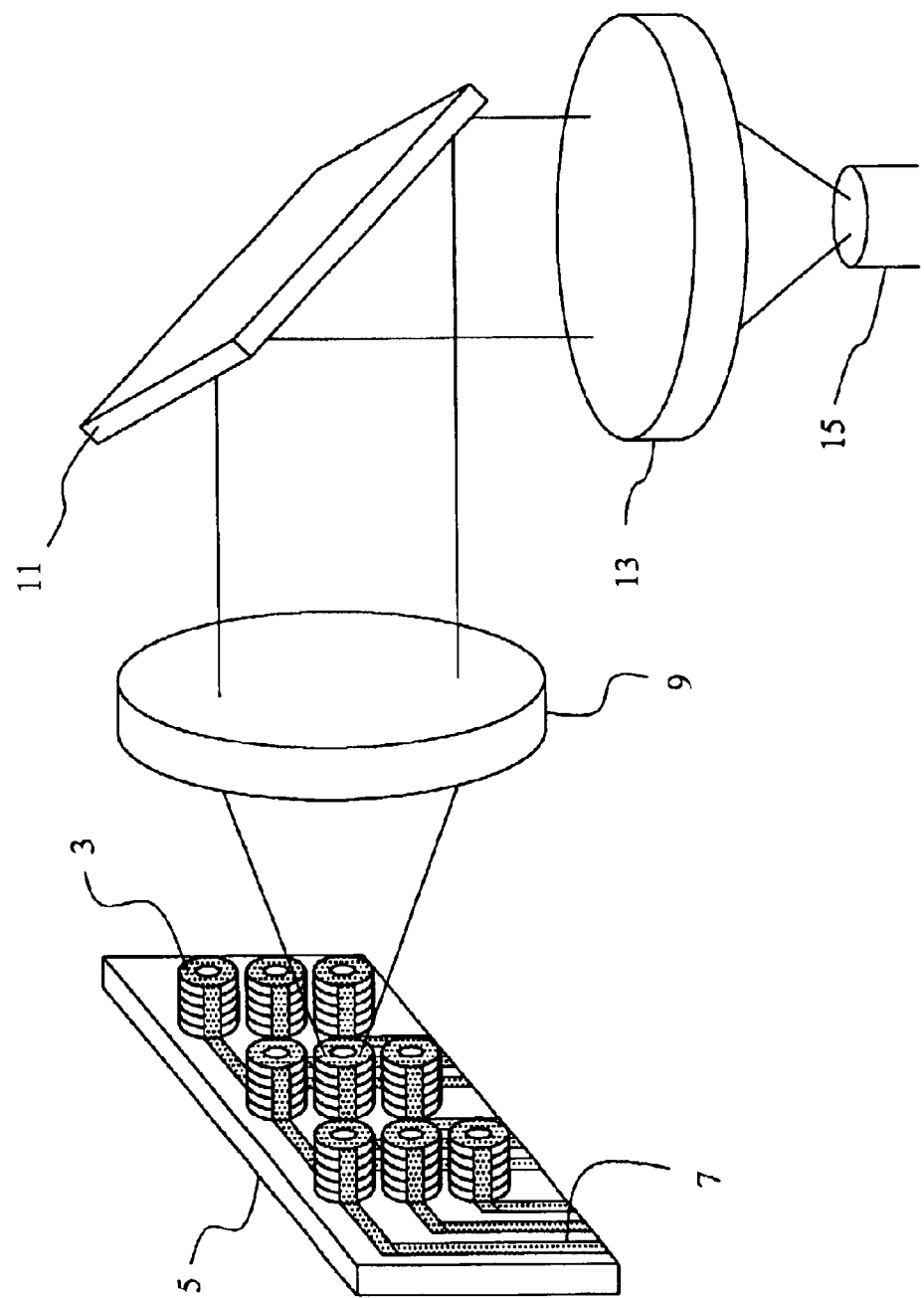
FIG. 1 illustrates one embodiment of an optical arrangement of VCSELs coupled to an optical output.

FIG. 1 illustrates an embodiment in accordance with aspects of the present invention. A plurality of VCSELs 3 is formed on a substrate 5. As illustrated, nine such VCSELs are arranged in a three by three array. VCSELs emit from a top of a wafer and may be relatively closely packed in two-dimensional arrays, as illustrated in FIG. 1. Each of the VCSELs has a different cavity length, and therefore each of the VCSELs emits light at a different wavelength. In the embodiment of FIG. 1 there is a three nanometer (nm) wavelength separation between VCSELs, for a total wavelength range of 27 nm. In other embodiments the wavelength separation between VCSELs is such that the array of VCSELs provide a substantially continuous tuning range when the VCSELs are tuned thermally or, for example, using charge injection. In different embodiments some of the VCSELs have the same cavity length, and thereby provide for redundant capability at a selected wavelength.

The VCSELs are driven with separate signals. The signals are provided by interconnect metallization lines 7, with each VCSEL coupled to a separate interconnect line. The interconnect line may provide a substantially constant signal, providing substantially constant output of the VCSEL, but in the embodiment of FIG. 1 is provided a modulated signal so as to modulate a data signal onto the emitted light, providing, for example, a directly modulated tunable laser system of a telecommunication network. As such, information such as a data signal is transmitted via the emitted light of a selected VCSEL lasing at a selected wavelength. The interconnect lines lead to contacts on the bottom of the substrate, in the embodiment illustrated. The contacts allow passage of signals to the interconnect lines. In an alternative embodiment the interconnect lines lead to various drive circuitry also located on the substrate, and such various drive circuitry is known in the art.

A collimating lens 9 is placed, for example, one focal length away from the VCSEL array. The collimating lens collimates the light from the VCSELs in the array of VCSELs. The light from the VCSELs exits the collimating lens at different positions and different angles due to the differing locations of the VCSELs.

The light exiting the collimating lens is reflected by a mirror 11. The mirror is a moveable mirror. In some embodiments the mirror is linearly translated. Linearly translatable mirrors may be actuated using a MicroElectroMechanical System (MEMS) actuator. Examples of such actuators include electrostatic comb drives combined with restoring springs, or thermally or electrically actuated devices. In some embodiments the mirror is a MEMS mirror rotatable about a single axis or about two axis. Manufacture of MEMS mirrors is relatively well known, and the mirrors may be fabricated using, for example, bulk micromachining with silicon wafers or silicon on insulator (SOI) wafers. The structure may formed by etching surfaces of the wafer with one or more masking steps, and multiple structures may be bonded together, for example using anodic bonding, to form a resultant structure. A metalization step may provide device contacts and also be used to form a highly reflective layer as the mirror surface. Backside etching and/or further etching steps on the front surface may also be useful to release strain or to create various device characteristics.

The mirror, in one embodiment, is a reflective element, surface or layer of a MEMS. The mirror is therefore a MEMS mirror. The MEMS mirror is rotatable on two axes. An example of such a MEMS mirror is described in U.S. Provisional Patent Application No. 60/309,669, entitled MEMS Mirror, filed Aug. 2, 2001, the disclosure of which is incorporated by reference herein. In one embodiment the MEMS mirror is electronically actuated by applying voltages to contact pads on the structure, although structures using current actuation or magnetic actuation may also be used.

In the embodiment of FIG. 1 the MEMS mirror is placed one focal length away from the collimating lens. The light from each of the VCSELS, therefore, impinges on the mirror at substantially the same position, but at different angles. Adjusting the tilt of the mirror, through rotation, allows for reflection of the light from each VCSEL along the same path. As the VCSELs are relatively closely packed and arranged in a two-dimensional array, the scanning range of the mirror is reduced compared to the scanning range necessary to access an array of an equal number of side emitting lasers, which cannot be packed as close and which are generally formed in a one-dimensional array. A decreased scanning range of the mirror is useful in that reliability and performance issues increase with increases in the scanning range of MEMS devices. In another embodiment the tilt of the mirror is set to reflect the light from each VCSEL along different optical paths, with other components transmitting the light to a common point. In embodiments where the mirror is not one focal length away the mirror is tilted to result in the light from each VCSEL being reflected to substantially a common point.

In the embodiment illustrated in FIG. 1 the light reflected from the mirror is directed to a focusing lens 13. The focusing lens couples the light to an optical waveguide 15, which in the embodiment of FIG. 1 is an optical fiber. In alternative embodiments, elements such as optical isolators and/or other elements may be placed in front of the optical fiber, or other waveguides such as those formed in lithium niobate may be used.

In operation of one embodiment, a particular VCSEL having a particular wavelength is activated. The mirror is positioned, for example using stored values, to a position directing the light from the particular VCSEL to the fiber optic line. Control circuitry may be provided to adjust the mirror position to maximize the optical power in the fiber. Operation of the device, therefore, provides a laser with a selectable wavelength output. The combination of selecting one mirror of the array and orienting the mirror thus allows the configuration to emit light at one of a number of wavelengths equal to the number of lasers. Continuous tuning at an infinite number of wavelengths can be obtained by thermally tuning the lasers in addition to selecting a particular element.

Figure 2:
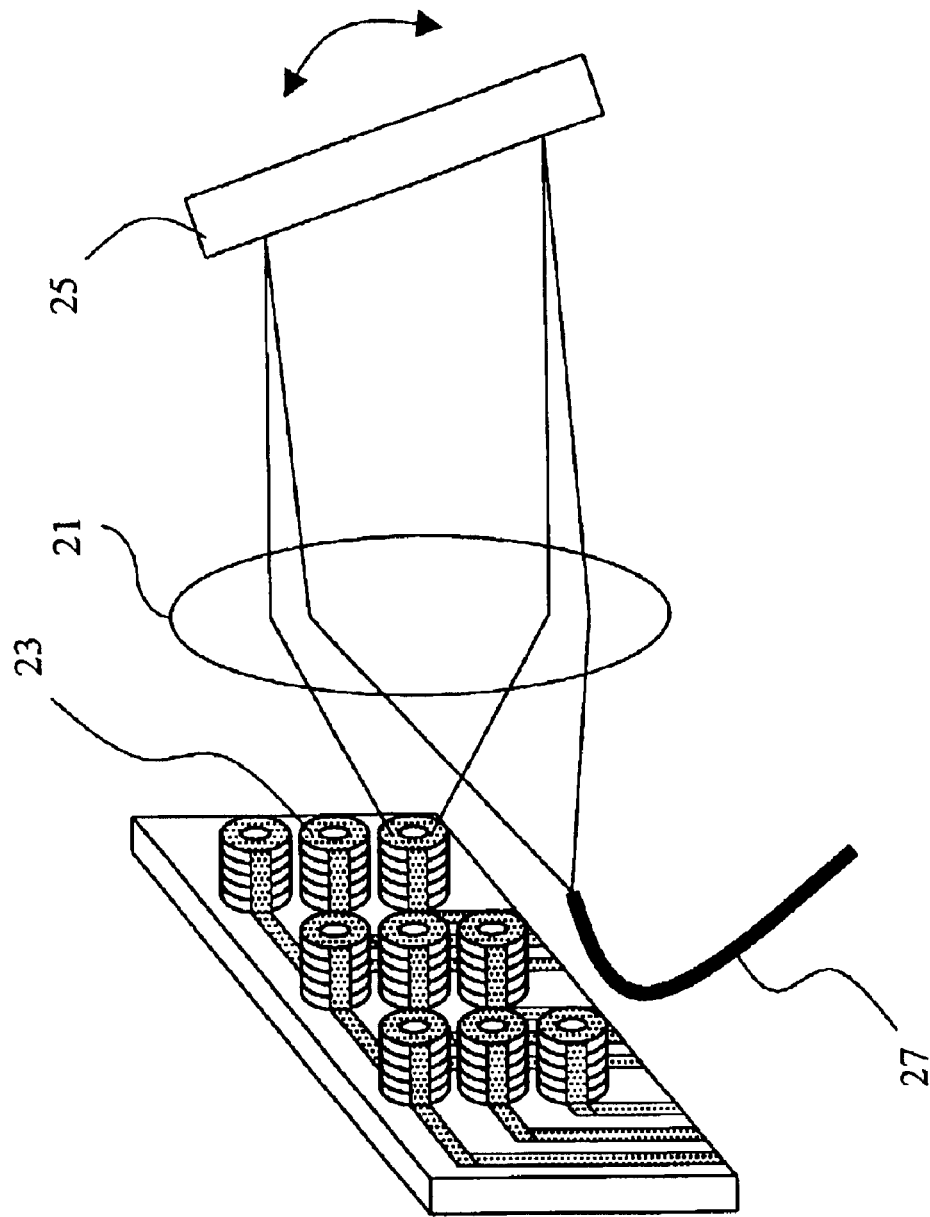
FIG. 2 illustrates another embodiment of an optical arrangement of VCSELs coupled to an optical output.

In a further embodiment, and as illustrated in FIG. 2, a collimating lens 21 receives light from a VCSEL in an array of VCSELs 23, any one of which may emit light at a given time. The collimated light is passed to an adjustable MEMS mirror 25. The MEMS mirror is substantially perpendicular to the beam of light, and therefore reflects the light back through the lens. The lens focuses the reflected light into an output fiber 27. This configuration is simpler than that described in FIG. 1, since only a single lens is used. A disadvantage is that the fiber is placed close to the laser array chip. In addition, with only one lens, it is more difficult to change the numerical aperture of the optical beam to match the laser mode to the fiber mode. In one embodiment an optical isolator is placed between the lens and the fiber to prevent reflections from the face of the fiber returning to the array of VCSELs.

Figure 3:
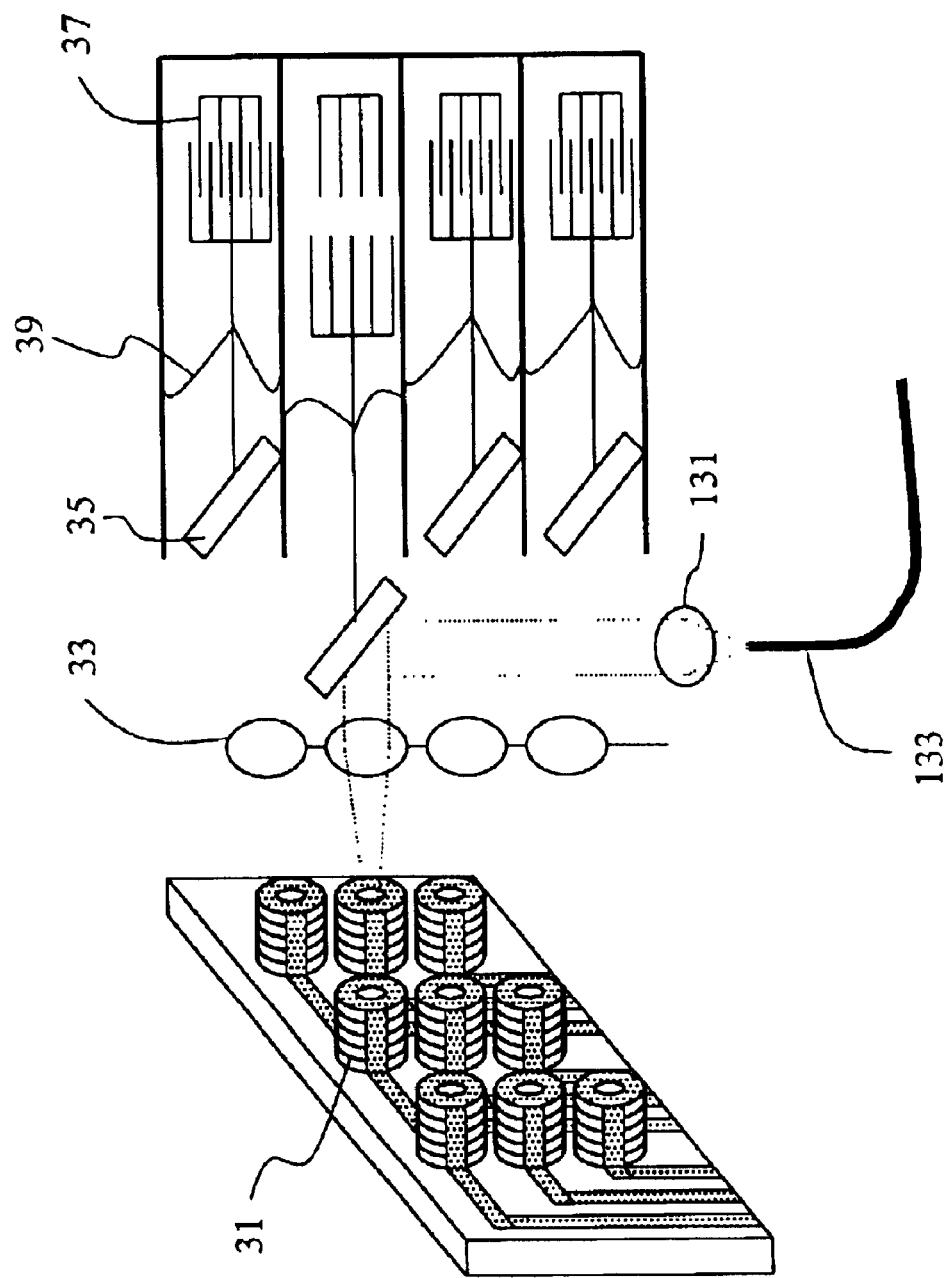
FIG. 3 illustrates another embodiment of an optical arrangement of VCSELs coupled to an optical output.

In a further embodiment, such as illustrated in FIG. 3, each of the VCSELs in an array of VCSELs 31 pass light through individual micro-collimating lenses 33. The beams of light formed by the micro-collimating lenses are passed to an array of micromirrors 35. As illustrated, each of the micromirrors are positionable using an electrostatic comb structure 37 and flexible current driven spring 39, which linearly translate the mirror in two opposing directions.

Light from a particular VCSEL is selected by positioning one of the mirrors to reflect light from the particular VCSEL to a focusing lens 131. The focusing lens focuses the light into an optical fiber 133. Only light from the particular VCSEL is passed into the optical fiber as the light from the other VCSELs does not have an optical path to the optical fiber.

Figure 4:
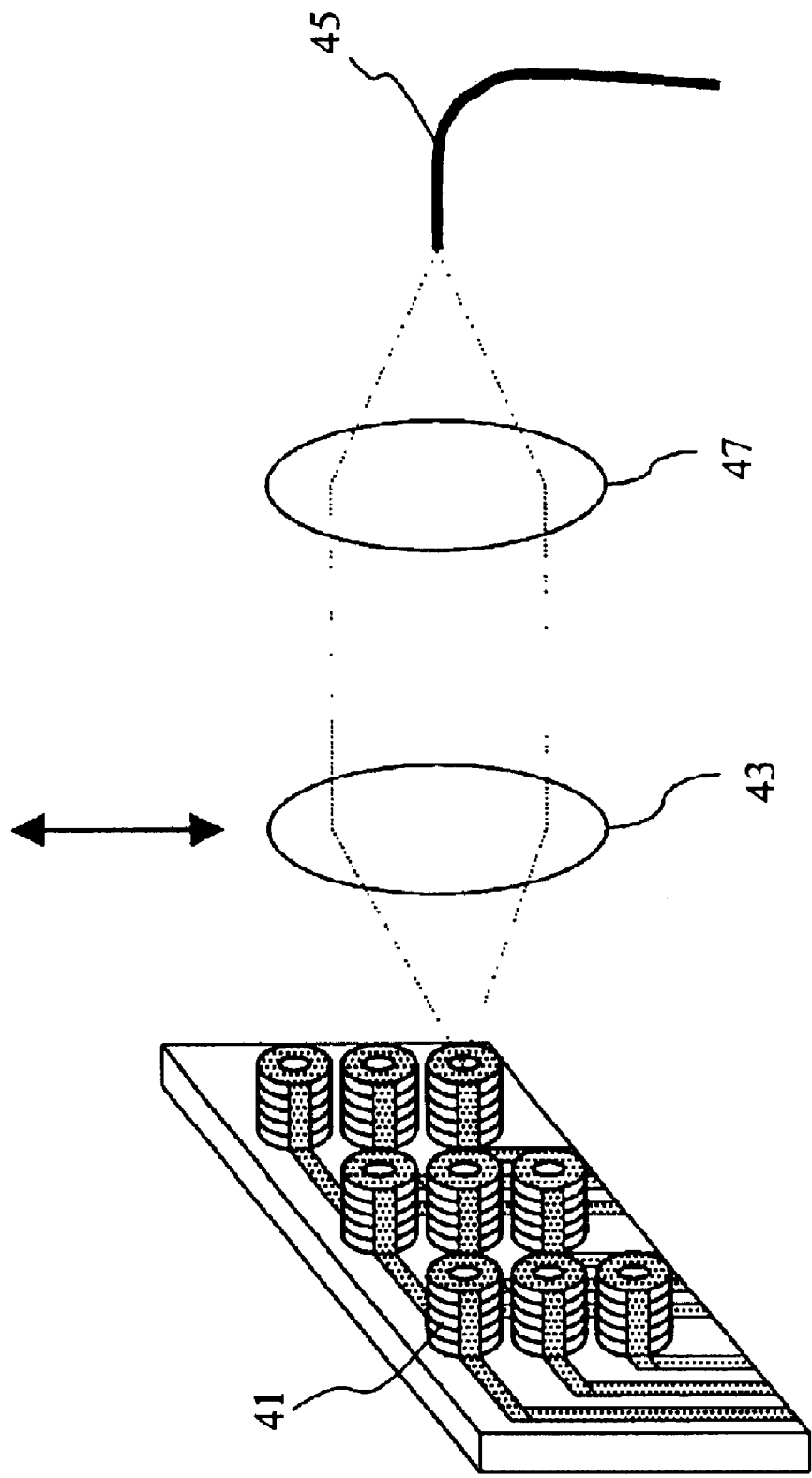
FIG. 4 illustrates another embodiment of an optical arrangement of VCSELs coupled to an optical output.

The same functionality is also be obtained with a single MEMs mirror that can be linearly translated over a larger distance. In this case the single mirror, tilted at 45 degrees to the collimated beam, moves over the micro-lensed array to deflect the beam into the fiber. When the mirror is over a particular laser, the beam from that laser is deflected towards the focusing lens 31 and into the optical fiber In further embodiments, other optical arrangements, such as MEMS based optical coupling devices, are used to couple light from a VCSEL array to an optical fiber. For example, in one embodiment, a lens 43 is placed in a structure positionable by a MEMS actuator. Movement of the lens, such as illustrated in FIG. 4, results in focusing light from a particular VCSEL in an array of VCSELs 41 either into an optical fiber 45 or a into a pathway reaching an optical fiber, e.g., through focusing lens 47. In another embodiment, a prism is positionable using a MEMS actuator to achieve the same result.

Although the present invention has been described with respect to certain embodiments, those of skill in the art would recognize insubstantially different variations thereof. Accordingly, the present invention should be viewed as the invention supported by this disclosure and insubstantial variations thereof.

What is claimed is:

1. An optical arrangement comprising:
   a plurality of vertical cavity surface emitting lasers (VCSELs) having differing cavity lengths, each laser (VCSEL) adapted to emit light at differing wavelengths;
   a single moveable optical element to direct light from any of the plurality of VCSELs towards an output path; and
   an optical output configured to receive light on the output path.

2. The optical arrangement of claim 1 wherein a first of the VCSELs has a cavity length that corresponds to a second of the VCSELS and the first of the VCSELs has a cavity length that does not correspond to a third of the VCSELs.

3. The optical arrangement of claim 1 wherein the VCSELs are positioned as an array and separated from each other.

4. The optical arrangement of claim 3 wherein the VCSELs are thermally and/or electrically tunable, and the VCSELs emit light at differing wavelengths such that the VCSELs provide a continuous tuning range when thermally and/or electrically tuned.

5. The optical arrangement of claim 1 further comprising a plurality of rnetallization lines, each line coupled to a VCSEL from the VOSELs.

6. The optical arrangement of claim 1 wherein the optical element is a micro electrical mechanical system mirror and is placed about one focal length away from the collimating lens.

7. The optical arrangement of claim 1 wherein each VCSEL of the VCSELs is electrically or thermally tunable to emit light over a small range of wavelengths.

8. The optical element of claim 1 wherein the optical element is movable to direct light from each VCSEL of the VCSELs along a same optical path.

9. The optical element of claim 1 wherein the optical element is movable to direct light from each VCSEL of the VCSELs along different optical paths, and further comprising at least one second optical element configured to provide light from the optical element to a common point.

10. An optical arrangement comprising:
    a plurality of lasers having differing cavity lengths, each laser configured to emit light;
    collimating lens configured to receive light from each laser;
    an optical element configured to direct light from the collimating lens back through the collimating lens; and
    an optical output configured to receive light from the collimating lens, the collimating lens further configured to focus light into the optical output.

11. The optical arrangement of claim 10 further comprising a second optical element placed between the collimating lens and the optical element.

12. The optical element of claim 11 wherein the second optical element is configured to prevent reflections from the optical output from returning to the plurality of lasers.

13. The optical arrangement of claim 10 wherein the plurality of lasers is a plurality of vertical cavity surface emitting lasers.

14. An optical arrangement comprising:
    a plurality of lasers having differing cavity lengths, each laser configured to emit light;
    a movable lens configured to receive light from each laser;
    an actuator configured to move the movable lens;
    an optical output configured to receive light from the movable lens.

15. The optical arrangement of claim 14 wherein the actuator is a micro electrical mechanical system actuator.

16. The optical arrangement of claim 15 wherein the actuator moves the movable lens along one axis, such that light from a particular laser of the plurality of laser is directed to a into the optical output.

17. A wavelength tunable laser comprising:
    a vertical cavity surface emitting laser (VCSEL) array including a first VOSEL laser diode that generates a first beam of light in a first wavelength range and a second VOSEL diode that generates a second beam of light in a second wavelength range;
    an optical waveguide; and a single microelectromechanical (MEMS) optical element adjustable to selectively couple one of said first and second beams of light from said VCSEL array into said optical waveguide.

18. A method for providing a beam of laser light having a tunable wavelength, comprising the steps of:

provoding a vertical cavity surface emitting laser (VCSEL) array;

generating a first beam of light in a first wavelength range using a first VCSEL diode of said VCSEL array;

generating a second beam of light in a second wavelength range using a second VCSEL diode of said VCSEL array;

collimating at least one of said first and second beams of light; and tilting a single mirror using a MEMS actuator to selectively couple one of said first and second beams of light from said VCSEL array into said optical waveguide.

19. A telecommunication network including a tunable laser system, the tunable laser system providing an optical signal transmitting information over a fiber optic line, the optical signal being of a wavelength selected from a plurality of predetermined wavelengths, the tunable laser comprising:

an array of vertical cavity surface emitting lasers (VCSEL), each of the VCSELs emitting light in a predetermined wavelength range, at least some of the VCSELs emitting light in different wavelength ranges, and a single MEMS mirror moveable so as to couple light from any one of the VCSELs on a path expected to result in transmission of the light on the fiber optic line.

* * * * *